US012562218B2

(12) United States Patent
Huang et al.

(10) Patent No.: US 12,562,218 B2
(45) Date of Patent: Feb. 24, 2026

(54) MEMORY AND ITS OPERATION METHODS, MEMORY SYSTEMS, AND ELECTRONIC DEVICES

(71) Applicant: Yangtze Memory Technologies Co., Ltd., Hubei (CN)

(72) Inventors: Wei Huang, Wuhan (CN); Weiwei He, Wuhan (CN); Weijun Wan, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 191 days.

(21) Appl. No.: 18/488,961

(22) Filed: Oct. 17, 2023

(65) Prior Publication Data

US 2024/0420756 A1 Dec. 19, 2024

(30) Foreign Application Priority Data

Jun. 19, 2023 (CN) .......................... 202310735602.0

(51) Int. Cl.
*G11C 7/10* (2006.01)
*G11C 11/4091* (2006.01)
*G11C 11/4093* (2006.01)
*G11C 11/4097* (2006.01)

(52) U.S. Cl.
CPC ...... *G11C 11/4093* (2013.01); *G11C 11/4091* (2013.01); *G11C 11/4097* (2013.01)

(58) Field of Classification Search
CPC ............ G11C 11/4093; G11C 11/4091; G11C 11/4097
See application file for complete search history.

(56) References Cited

U.S. PATENT DOCUMENTS

| | | | | |
|---|---|---|---|---|
| 2005/0265096 A1* | 12/2005 | Obara | ...................... | G11C 7/12 |
| | | | | 257/E27.081 |
| 2006/0114052 A1* | 6/2006 | Fukuda | .................. | G11C 17/14 |
| | | | | 257/E23.149 |
| 2018/0292989 A1* | 10/2018 | Lee | ........................ | G06F 3/0659 |
| 2022/0229558 A1* | 7/2022 | Choi | ................... | G11C 11/5628 |
| 2023/0037585 A1* | 2/2023 | Yang | ..................... | G11C 7/1057 |
| 2023/0187011 A1* | 6/2023 | Lee | ....................... | G11C 29/022 |
| | | | | 365/185.09 |

* cited by examiner

*Primary Examiner* — Min Huang
(74) *Attorney, Agent, or Firm* — Hanley, Flight & Zimmerman, LLC

(57) ABSTRACT

The implementation of the present disclosure discloses a memory and its operation method, a memory system and an electronic device. The memory includes: a memory cell array and a page buffer, the page buffer is disposed corresponding to a bit line of the memory cell array, and the page buffer includes: a precharge and discharge circuit coupled to the bit line through a sense node of the page buffer and including a first type transistor; a plurality of latches respectively coupled to the sense node, wherein at least one of the plurality of latches includes a second type transistor, and a characteristic size of the second type transistor is smaller than that of the first type transistor.

16 Claims, 6 Drawing Sheets

10

10

60

70

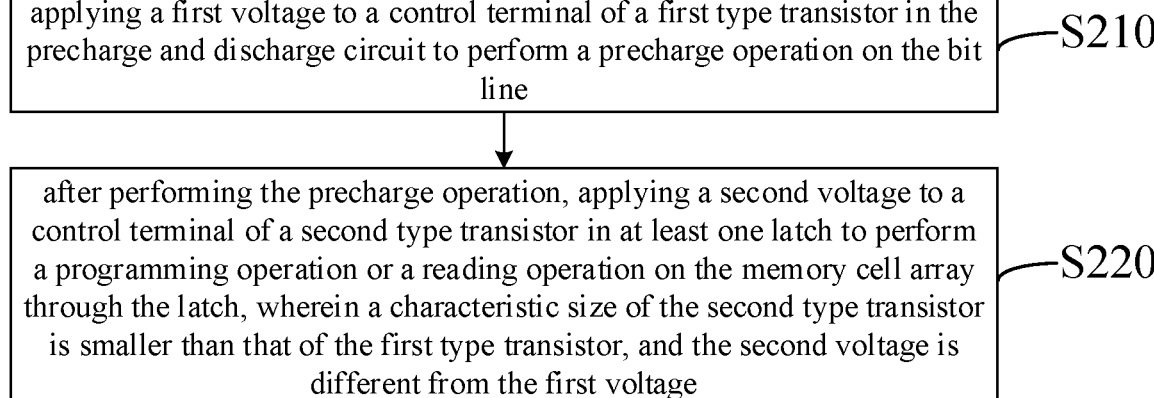

applying a first voltage to a control terminal of a first type transistor in the precharge and discharge circuit to perform a precharge operation on the bit line ⟋S210 after performing the precharge operation, applying a second voltage to a control terminal of a second type transistor in at least one latch to perform a programming operation or a reading operation on the memory cell array through the latch, wherein a characteristic size of the second type transistor is smaller than that of the first type transistor, and the second voltage is different from the first voltage ⟋S220

FIG. 5

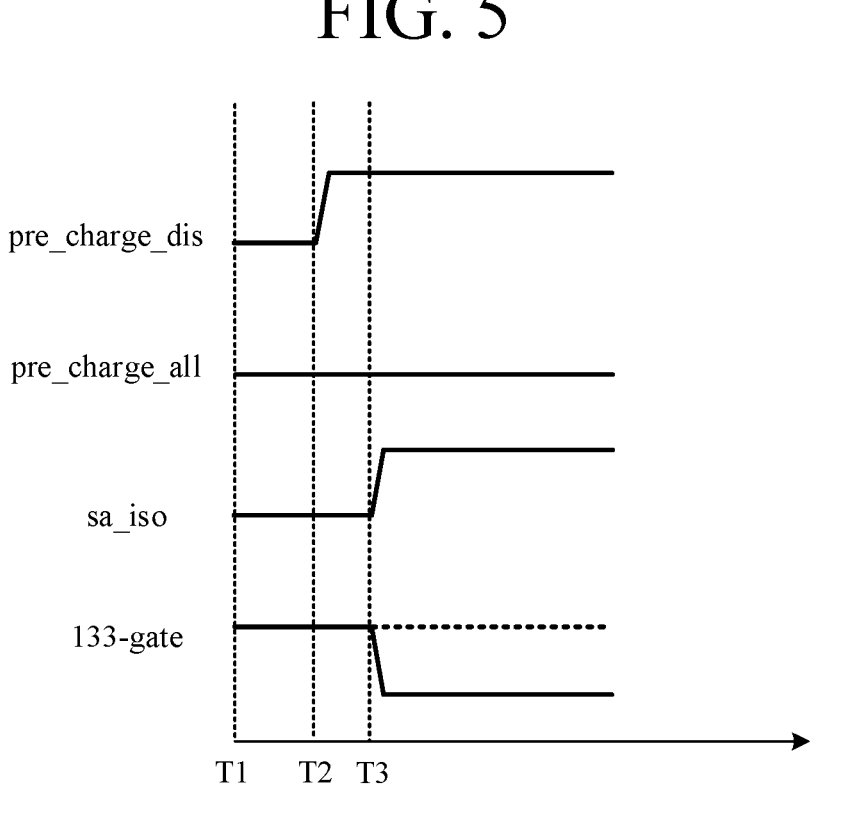

pre_charge_dis pre_charge_all sa_iso 133-gate

MEMORY AND ITS OPERATION METHODS, MEMORY SYSTEMS, AND ELECTRONIC DEVICES

REFERENCE TO RELATED APPLICATIONS

This application claims priority to and the benefit of Chinese Patent Application 202310735602.0, filed on Jun. 19, 2023, which is hereby incorporated by reference in its entirety.

TECHNICAL FIELD

The implementation of the present disclosure relates to semiconductor technology, and relates to but is not limited to a memory and its operation method, memory system and electronic device.

BACKGROUND

Semiconductor memories can be roughly divided into two types, depending on whether they retain the stored data when power is off; these two types of semiconductor memories are: volatile memory and nonvolatile memory. A volatile memory loses the stored data when power is off, and a nonvolatile memory retains the stored data when power is off. A memory cell in a nonvolatile memory is connected to a bit line and a word line respectively, so it has good random access time characteristics.

BRIEF DESCRIPTION OF DRAWINGS

In the accompanying drawings, similar reference numerals may describe similar components in different views. Similar reference numerals with different letter suffixes may represent different examples of similar components. The accompanying drawings generally illustrate the various implementations discussed herein by way of example rather than limitation.

FIG. 5 is a flowchart of an operation method of a memory provided by an implementation of the present disclosure;

FIG. 6A and FIG. 6B are timing diagrams of an operation method of a memory provided by an implementation of the present disclosure.

DETAILED DESCRIPTION

For the facility of understanding the disclosure, the disclosure will be described more comprehensively below with reference to the relevant accompanying drawings. Preferred implementations of the present disclosure are shown in the accompanying drawings. However, the present disclosure can be implemented in many different forms and is not limited to the implementations described herein. On the contrary, the purpose of providing these implementations is to make the disclosure more thorough and comprehensive.

Unless otherwise defined, all technical and scientific terms used herein have the same meanings understood by those skilled in the technical field of the present disclosure. The terms used in the description of the disclosure herein are only for the purpose of describing implementations, and are not intended to limit the disclosure. The term "at least one of" as used herein includes any and all combinations of one or more related listed items.

With the improvement of memory integration, an area occupied by a page buffer in a peripheral circuit of a memory is limited and there is a demand that its area tends to be reduced, so how to reduce the area of the page buffer has become an urgent technical problem to be solved.

Figure 1A:
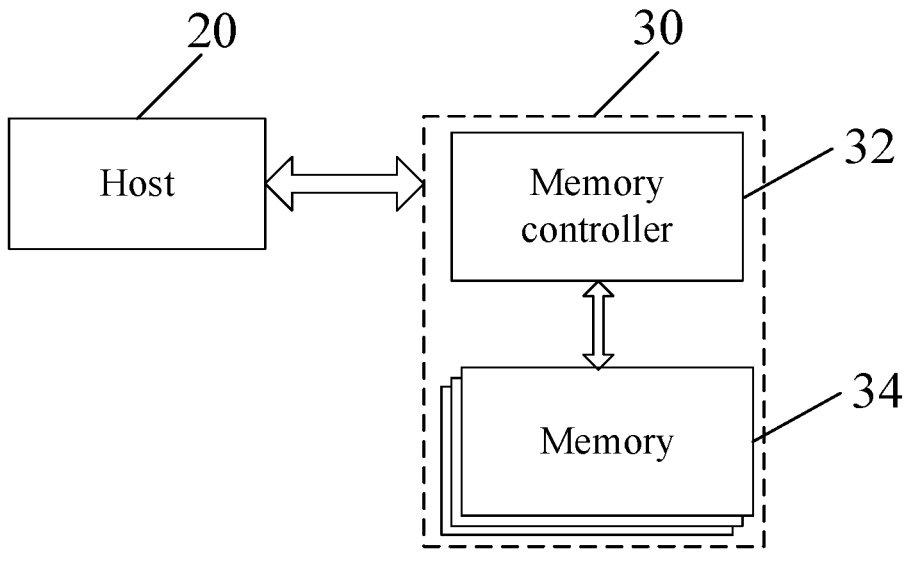
FIG. 1A is a schematic structural diagram of an example system provided by an implementation of the present disclosure.

As shown in FIG. 1A, the implementation of the present disclosure shows an example system 10, which may include a host 20 and a memory system 30. The example system 10 may include, but is not limited to, a mobile phone, a desktop computer, a laptop computer, a tablet computer, a vehicle computer, a game console, a printer, a positioning device, a wearable electronic device, an intelligent sensor, a virtual reality (VR) device, an augmented reality (AR) device, or any other suitable electronic device having a memory 34 therein; the host 20 may be a processor (e.g., a central processing unit (CPU) or a system on chip (SOC) (e.g., an application processor (AP)) of an electronic device.

In an implementation of the present disclosure, the host 20 may be configured to send data to or receive data from the memory system 30. Here, the memory system 30 may include a memory controller 32 and one or more memories 34. The memory 34 may include, but is not limited to, a NAND flash memory, a vertical NAND flash memory, a NOR flash memory, a dynamic random access memory (DRAM), a ferroelectric random access memory (FRAM), a magnetic random access memory (MRAM), a phase change random access memory (PCRAM), a resistive random access memory (RRAM), nano random access memory (NRAM), etc.

In an implementation of the present disclosure, the memory controller 32 can be coupled to the memory 34 and the host 20, and is configured to control the memory 34. For example, the memory controller 32 may be designed to operate in a low duty cycle environment, such as a secure digital (SD) card, a compact flash (CF) card, a universal serial bus (USB) flash drive, or other media for use in electronic devices such as a personal calculator, a digital camera, a mobile phone, etc. In some implementations, the memory controller 32 can also be designed to operate in a high duty cycle environment, such as an SSD or an embedded multi-media card (EMMC), and the SSD or EMMC can be used as a data storage for a mobile device such as a smart phone, a tablet computer, and a laptop computer, and an enterprise storage array.

Further, the memory controller 32 may manage the data in the memory 34 and communicate with the host. The memory controller 32 may be configured to control an operation such as reading, erasing, and programming of the memory 34; it can also be configured to manage various functions related to the data stored or to be stored in the memory 34, including but not limited to bad block management, garbage collection, logical to physical address translation, loss balancing, etc.; it may also be configured to process error checking and correction (ECC) codes related to data read from or written to the memory 34. In addition, the memory controller 32 may also perform any other suitable function, such as formatting the memory 34, or communicating with an external device (e.g., the host 20 in FIG. 1A) according to a communication protocol. For example, the memory controller 32 may communicate with an external host through at least one of various interface protocols, such as a USB protocol, a MMC protocol, a peripheral component interconnect (PCI) protocol, a PCI-E protocol, an advanced technology attachment (ATA) protocol, a serial ATA protocol, a parallel ATA protocol, a small computer system interface (SCSI) protocol, an enhanced small disk interface (ESDI) protocol, an integrated development equipment (IDE) protocol, a firewire protocol, etc.

Figure 1B:
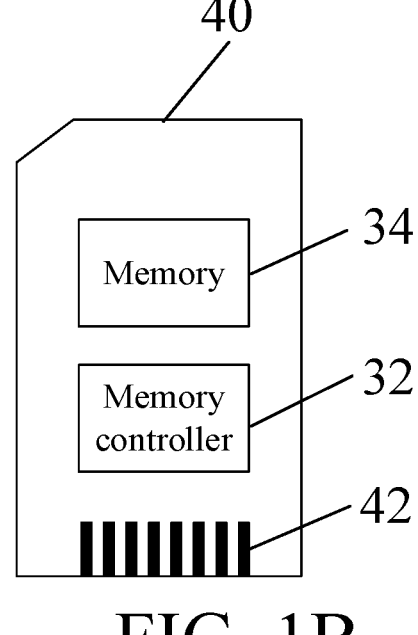
FIG. 1B is a schematic structural diagram of a memory card provided by an implementation of the present disclosure.
Figure 1C:
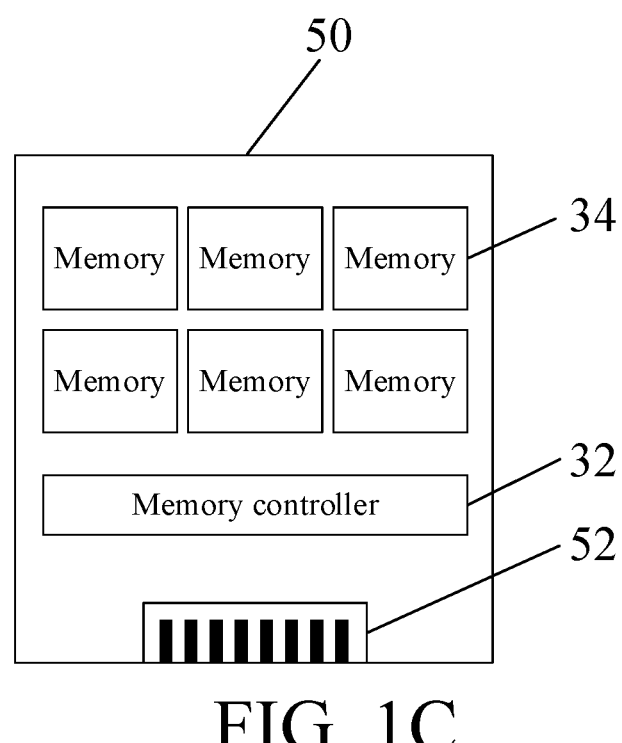
FIG. 1C is a schematic structural diagram of a solid state disk (SSD) provided by an implementation of the present disclosure.

In an implementation of the present disclosure, the memory controller 32 and one or more memories 34 may be integrated into various types of storage devices, for example, included in the same package (e.g., a universal flash storage (UFS) package or an EMMC package). That is, the memory system 30 can be implemented and packaged into different types of terminal electronic products. As shown in FIG. 1B, the memory controller 32 and a single memory 34 may be integrated together to form a memory card 40. The memory card 40 may include a PC card (personal computer memory card), a CF (compact flash) card, a smart media (SM) card, a memory stick, a multi-media card (MMC, an reduced size MMC (RS-MMC), an MMCmicro), an SD card (SD, miniSD, microSD, secure digital high capacity (SDHC)), a UFS, and the like. The memory card 40 may also include a memory card connector 42 that couples the memory card 40 to a host (e.g., the host 20 in FIG. 1A). In another implementation as shown in FIG. 1C, the memory controller 32 and a plurality of memories 34 may be integrated together to form an SSD 50. The SSD 50 may also include an SSD connector 52 that couples the SSD 50 to a host (e.g., the host 20 in FIG. 1A). In some implementations, the storage capacity and/or operation speed of SSD 50 is larger than that of the memory card 40.

Figure 1D:
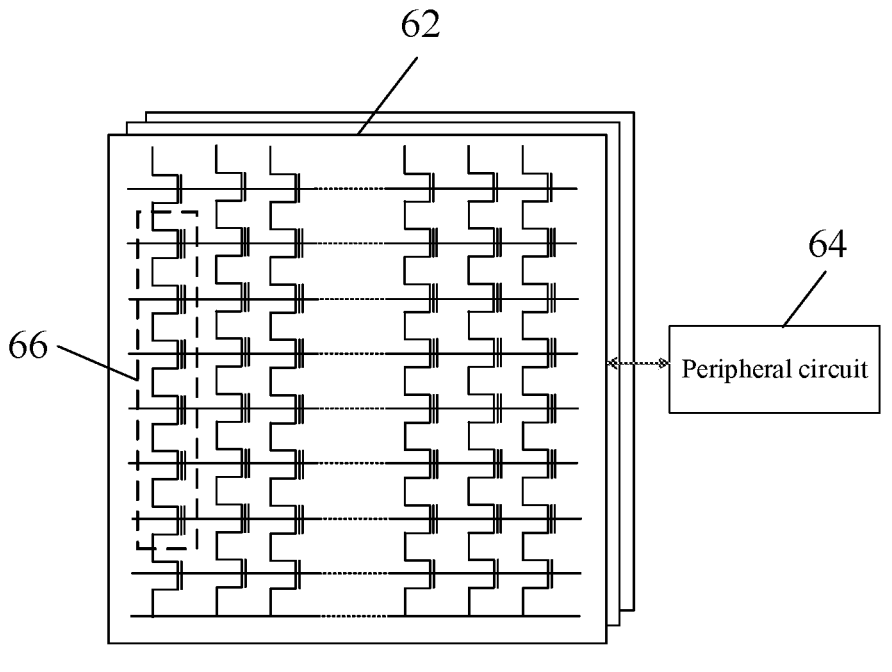
FIG. 1D and FIG. 1E are schematic structural diagrams of a memory including a memory cell array and a peripheral circuit provided by an implementation of the present disclosure.

It should be noted that the memory according to an implementation of the present disclosure can be a semiconductor memory, which is a solid-state electronic device made using semiconductor integrated circuit technology to store data information. For example, FIG. 1D is a schematic diagram of an optional memory 60 in the implementation of the present disclosure. The memory 60 may be the memory 34 in FIGS. 1A to 1C. As shown in FIG. 1D, the memory 60 may include a memory cell array 62, a peripheral circuit 64 coupled to the memory cell array 62, and the like. Here, the memory cell array may be a NAND flash memory cell array, wherein the memory cells are arranged in the form of an array of NAND memory strings 66, and each NAND memory string 66 extends vertically above the substrate. In some implementations, each NAND memory string 66 may include a plurality of memory cells coupled in series and stacked vertically. Each memory cell may maintain a continuous analog value, such as a voltage or a charge, depending on the number of electrons captured in the memory cell area. In addition, each memory cell in the above memory cell array 62 may be a floating gate type memory cell including a floating gate transistor, or a charge capture type memory cell including a charge capture transistor.

In an implementation of the present disclosure, the above memory cell can be a single level cell (SLC) with two possible storage states and therefore can store one bit of data. For example, a first storage state "0" may correspond to a first threshold voltage range, and a second storage state "1" may correspond to a second threshold voltage range. In other implementations, each memory cell may be a multi-level cell (MLC) capable of storing more than a single bit of data in more than four storage states. For example, MLC can store two bits per cell, three bits per cell (also known as triple level cell (TLC)), or four bits per cell (also known as Quad level cell (QLC)). Each MLC can be programmed to a range of possible nominal stored values. For example, if each MLC stores two bits of data, the MLC may be programmed to program the memory cell from an erase state to one of three possible programming levels by writing one of three possible nominal storage values to the memory cell, wherein a fourth nominal stored value can be used for the erase state.

Figure 1E:
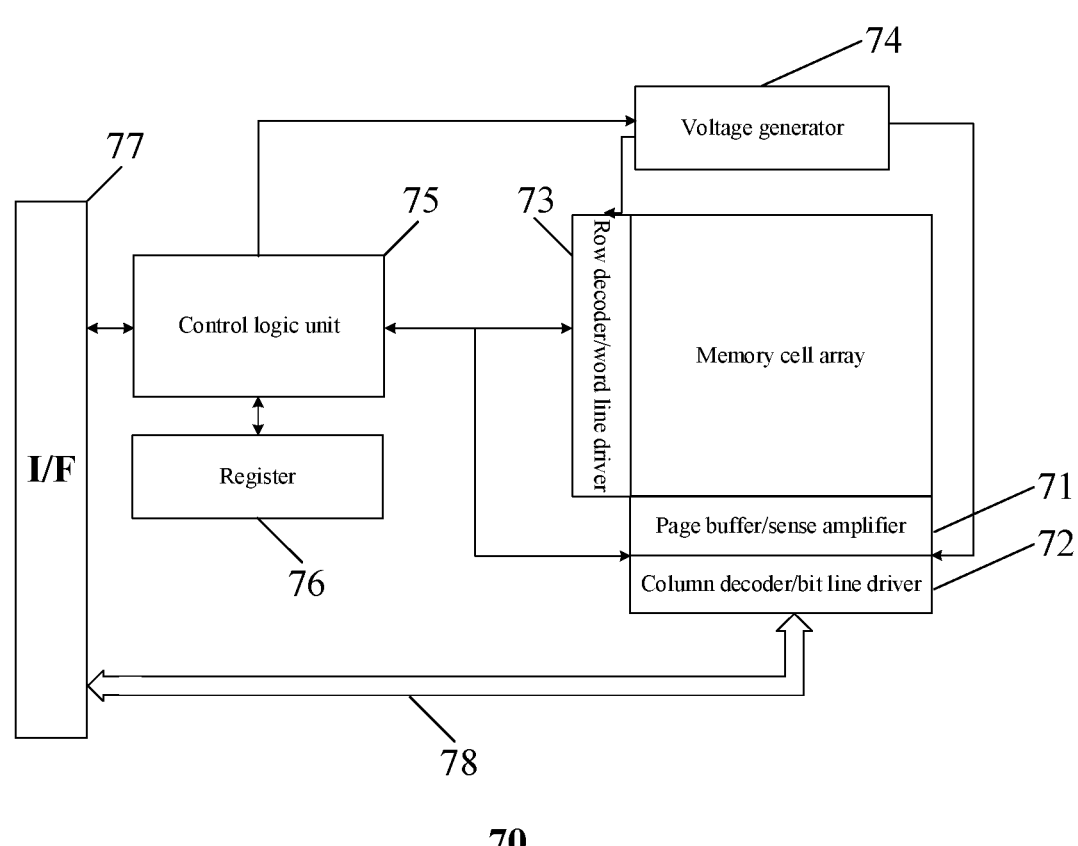

In the implementation of the present disclosure, the above peripheral circuit can be coupled to the memory cell array through a bit line (BL), a word line (WL), a source line (SL), a source select gate (SSG) and a drain select gate (DSG). Here, the peripheral circuit may include any suitable analog, digital, and mixed signal circuits for facilitating a related operation of the memory cell array by applying voltage and/or current signals to and sensing voltage and/or current signals from each target memory cell via a bit line, a word line, a source, an SSG, a DSG, or the like. In addition, the peripheral circuit may also include various types of peripheral circuits formed using metal oxide semiconductor (MOS) technology. For example, as shown in FIG. 1E, the peripheral circuit 70 may include a page buffer (PB)/sense amplifier 71, a column decoder/bit line driver 72, a row decoder/word line driver 73, a voltage generator 74, a control logic unit 75, a register 76, an interface 77, and a data bus 78. It should be understood that the peripheral circuit 70 described above may be the same as the peripheral circuit 64 in FIG. 1D, and in other implementations, the peripheral circuit 70 may also include additional peripheral circuits not shown in FIG. 1E.

Figure 1F:
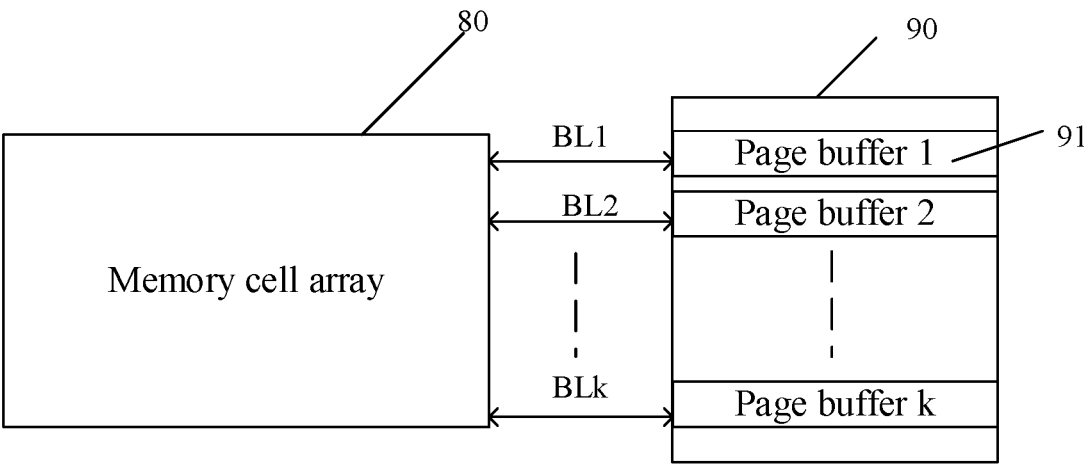
FIG. 1F is a schematic structural diagram of a memory including a page buffer provided by an implementation of the present disclosure.

As shown in FIG. 1F, an implementation of the present disclosure shows a page buffer group 90. The page buffer group 90 may be coupled to a memory cell array 80 via a plurality of bit lines BL1 to BLK. The page buffer group 90 may include a page buffer 1 (PB1) to a page buffer K (PBK), each of which is coupled to the memory cell array via a bit line. For example, page buffers PB1 to PBK may be coupled to the memory cell array via corresponding bit lines BL1 to BLK, respectively.

With the increase of the number of stacked film layers in the memory, the peripheral circuit will limit the further reduction of the size of the memory. At present, the page buffer 91 occupies the largest share of the peripheral circuit. Therefore, under the background of increasingly miniaturized memory, how to reduce the area of page buffer 91 has become an urgent technical problem to be solved.

In view of this, the implementation of the present disclosure provides a memory, an operation method thereof, a memory system, and an electronic device.

Figure 2:
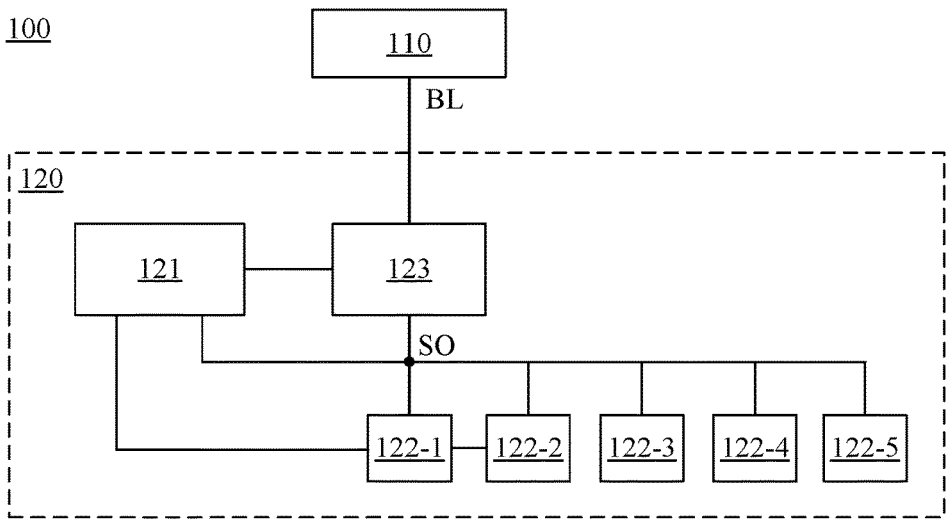
FIG. 2 is a schematic diagram of a memory provided by an implementation of the present disclosure.
Figure 3:
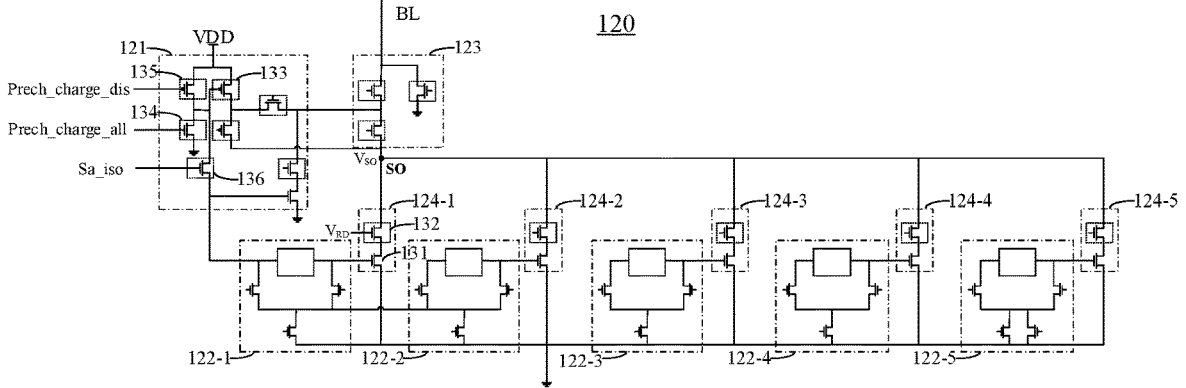
FIG. 3 is a schematic diagram of a page buffer provided by an implementation of the present disclosure.
Figure 4:
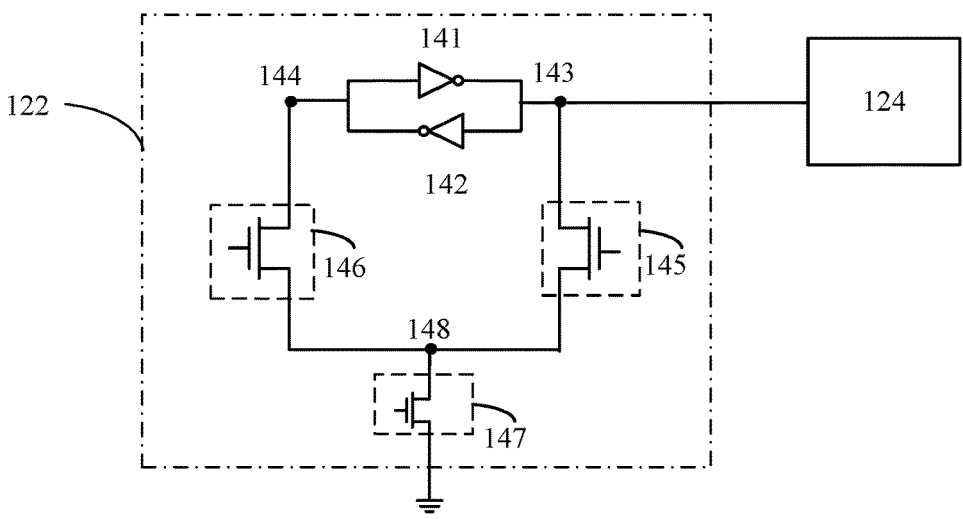
FIG. 4 is a schematic diagram of a latch provided by an implementation of the present disclosure.

FIG. 2 is a schematic diagram of a memory 100 provided by the implementation of the present disclosure, FIG. 3 is a circuit diagram of a page buffer 120 provided by the implementation of the present disclosure, and FIG. 4 is a schematic diagram of a latch 122 provided by the implementation of the present disclosure. The memory 100, the page buffer 120 and the latch 122 provided by the implementations of the present disclosure will be further described below in combination with FIGS. 2 to 4.

Referring to FIG. 2 and FIG. 3, the memory 100 includes a memory cell array 110 and a page buffer 120, and the page buffer 120 is disposed corresponding to the bit line BL of the memory cell array 110; the page buffer 120 includes:

a precharge and discharge circuit 121 coupled to a bit line BL through a sense node SO of the page buffer 120 and including a first type transistor;

a plurality of latches 122 respectively coupled to the sense node SO, wherein at least one of the plurality of latches 122 includes a second type transistor, and the characteristic size of the second type transistor is smaller than that of the first type transistor.

The memory 100 includes a memory cell array 110 and a peripheral circuit, the peripheral circuit includes the page buffer 120 which is coupled with the memory cell array 110 through the bit line BL. The number of page buffers 120 in the memory 100 may be one or more. For convenience of illustration, only one page buffer 120 is shown in FIG. 2.

The precharge and discharge circuit 121 is respectively coupled to the power supply terminal and the sense node SO. The precharge and discharge circuit 121 is configured to adjust a voltage of the bit line BL in the process of executing a logic (e.g., programming, reading or writing) operation. For example, the voltage is applied to the bit line BL to realize the precharge of the bit line BL; alternatively, the voltage of the bit line BL is pulled down to the ground voltage to discharge the bit line BL.

In some implementations, in the process of performing a programming operation on the memory cell, a programming forbidden bit line voltage (e.g., VDD) or a normal programming bit line voltage (e.g., VSS) can be applied to the bit line BL connected to the memory cell through the precharge and discharge circuit 121. For example, a high level is applied to the bit line BL through the charging function of the precharge and discharge circuit 121 to achieve the effect of forbidding programming, or the bit line BL is discharged through the discharge function of the precharge and discharge circuit 121 to pull down the voltage of the bit line BL to the ground voltage to achieve the effect of allowing programming.

The page buffer 120 includes a plurality of latches, such as latches 122-1, 122-2, 122-3, 122-4, and 122-5. The latch can latch data according to a sensed voltage of the sense node SO, for example, latching data "0" or "1". For convenience of illustration, five latches are shown in FIG. 3. The number of latches in the page buffer 120 is not limited to this, and can be set according to the actual device.

The first type transistor and the second type transistor can be a collection of one or more transistors. The transistors framed with a dotted line frame in the precharge and discharge circuit 121 are the first type transistor, and the transistors not framed with a dotted line frame in the latch are the second type transistor, as shown in FIG. 3. For example, the first type transistor includes multiple transistors. At least one of a conductive type, a characteristic size, or a doping concentration of the active region of any two transistors of the first type transistors can be the same or different. Here, the conductive type includes P-type or N-type, and the characteristic size can be expressed by at least one of the length of the channel of the transistor, the width of the channel of the transistor, the length of the gate of the transistor, the width of the gate of the transistor, the length of the gate dielectric layer of the transistor or the width of the gate dielectric layer of the transistor.

In some implementations, the first type transistor includes a high voltage transistor (HV MOS), and the second type transistor includes at least one of a low voltage transistor (LV MOS) or a low low voltage transistor (LLV MOS). In some other implementations, the first type transistor includes a low voltage transistor, and the second type transistor includes a low low voltage transistor. In still some other implementations, the first type transistor includes a high voltage transistor and a low voltage transistor, and the second type transistor includes a low low voltage transistor.

It should be noted that high voltage, low voltage and low low voltage are relative concepts. Transistors can be divided into a high voltage transistor, a low voltage transistor and a low low voltage transistor according to the magnitude of the operation voltage (i.e. gate on voltage), wherein the operation voltages of the high voltage transistor, the low voltage transistor and the low low voltage transistor decrease in turn, and the thicknesses of the gate dielectric layers of the high voltage transistor, the low voltage transistor and the low low voltage transistor decrease in turn.

In some implementations, the absolute value of the threshold voltage of the second type transistor is smaller than the absolute value of the threshold voltage of the first type transistor. The threshold voltage represents the voltage applied when the transistor starts to turn on. The operation voltage represents the maximum voltage supplied to the source, drain and gate in the process of the operation of the transistor. Generally, the larger the threshold voltage of the transistor, the larger the corresponding operation voltage.

In some implementations, the thickness of the gate dielectric layer of the second type transistor is smaller than that of the first type transistor; in an implementation, the thickness of the gate dielectric layer of the first type transistor is 30 angstroms (Å) to 70 Å, for example, the thickness of the gate dielectric layer of the first type transistor is 32 Å or 69 Å. When the first type transistor includes a plurality of different transistors, the largest thickness of the gate dielectric layer in the second type transistor is smaller than the smallest thickness of the gate dielectric layer in the first type transistor.

In some implementations, the channel length of the second type transistor is smaller than that of the first type transistor.

In the implementation of the present disclosure, by making at least one of a plurality of latches include a second type transistor and the characteristic size of the second type transistor smaller than the characteristic size of the first type transistor, the area of at least one latch in the page buffer can be reduced, and then the area of the page buffer in the peripheral circuit can be reduced, which is conducive to reducing the area of the peripheral circuit in the memory, so as to realize the miniaturization of the memory.

Moreover, in the implementation of the present disclosure, at least one latch adopts a second type transistor with a smaller characteristic size. Accordingly, the voltage required for the operation of the second type transistor is smaller, which is conducive to reducing the power consumption of the memory.

In some implementations, the memory includes a plurality of bit lines, and the peripheral circuit includes a page buffer group; the page buffer group includes a plurality of page buffers; a plurality of page buffers are respectively coupled with the memory cell array via a plurality of bit lines; a latch of at least one of the plurality of page buffers includes a second type transistor. In an implementation, the latches of the plurality of page buffers each include the second type transistor, thereby reducing the area of the page buffer group in the peripheral circuit, which is more conducive to the miniaturization of the memory.

In some implementations, as shown in FIG. 2 and FIG. 3, the page buffer 120 also includes: a bit line voltage setting circuit 123 which is respectively coupled to the precharge and discharge circuit, the sense node SO and the bit line BL, and includes a third type transistor; the characteristic size of the second type transistor is smaller than that of the third type transistor.

The precharge and discharge circuit 121 is configured to supply the power supply voltage VDD from the power supply terminal to at least one of the bit line voltage setting circuit 123 or the sense node SO; the bit line voltage setting circuit 123 is configured to supply a bit line forced voltage to the bit line BL based on the power supply voltage VDD supplied by the precharge and discharge circuit 121; wherein, the normal programming bit line voltage<the bit line forced voltage<the programming forbidden bit line voltage. The bit line voltage setting circuit 123 may include a plurality of bit line voltage setting components, and different bit line forced voltages may be generated based on different bit line voltage setting components, for example, a first bit line forced voltage and a second bit line forced voltage. And the normal programming bit line voltage<the first bit line forced voltage<the second bit line forced voltage<the programming forbidden bit line voltage.

The above bit line voltage setting component can be an NMOS transistor, a PMOS transistor, or a combination of at least one of a plurality of NMOS transistors or a plurality of PMOS transistors. The bit line voltage setting component can also be other components that can be used for clamping voltage or adjusting voltage, such as a zener diode, a transient voltage suppressor, a varistor, etc.

Using the bit line voltage setting circuit 123, the fine programming of the memory cell can be realized based on applying different bit line forced voltages to the bit line BL by the precharge and discharge circuit 121, making the target threshold voltage distribution narrower, increasing the read window between the memory cells of different programming states, and ensuring the accurate reading of data.

The third type transistor can be a collection of one or more transistors. A transistor framed by a dotted line frame in the bit line voltage setting circuit 123 is the third type transistor, as shown in FIG. 3. At least one of a conductive type, a characteristic size, or a doping concentration of the active region of any two transistors of the third type transistors can be the same or different.

In some implementations, the third type transistor includes a high voltage transistor, and the second type transistor includes at least one of a low voltage transistor or a low low voltage transistor. In some other implementations, the third type transistor includes a low voltage transistor, and the second type transistor includes a low low voltage transistor. In still some other implementations, the third type transistor includes a high voltage transistor and a low voltage transistor, and the second type transistor includes a low low voltage transistor. Here, the threshold voltage of the transistor in the third type transistor and the threshold voltage of the transistor of the first type transistors may be the same or different, and the present disclosure has no special limitation on this.

In some implementations, the absolute value of the threshold voltage of the second type transistor is smaller than that of the third type transistor; the thickness of the gate dielectric layer of the second type transistor is smaller than that of the third type transistor; the channel length of the second type transistor is smaller than that of the third type transistor. In an implementation, the thickness of the gate dielectric layer of the third type transistor is 69 Å, and the largest thickness of the gate dielectric layer of the second type transistor is smaller than 69 Å.

It should be noted that the precharge and discharge circuit and the bit line voltage setting circuit in the page buffer usually need to perform corresponding analog operations in response to analog signals and replacing some of the transistors in the precharge and discharge circuit and the bit line voltage setting circuit with transistors of smaller sizes will affect the normal function of the page buffer.

In the implementation of the present disclosure, by replacing at least part of the transistors of the latch in the page buffer with the second type transistors of smaller characteristic sizes, the normal function of the page buffer can be ensured while reducing the area of the page buffer.

In some implementations, as shown in FIG. 3 and FIG. 4, the page buffer 120 also includes at least one read path and the read path includes:

a first transistor 131, wherein a first terminal of the first transistor 131 is coupled to a sense node SO, a second terminal of the first transistor 131 is coupled to a ground terminal, and a control terminal of the first transistor 131 is coupled to an output terminal of a latch 122, and wherein a characteristic size of the first transistor 131 is smaller than that of the first type transistor;

a second transistor 132, wherein a first terminal of the second transistor 132 is coupled to the sense node SO, a second terminal of the second transistor 132 is coupled to the first terminal of the first transistor 131, and a control terminal of the second transistor 132 is configured to receive a bias voltage, wherein a characteristic size of the second transistor 132 is larger than that of the first transistor 131.

As shown in FIG. 3, the page buffer 120 includes a plurality of read paths, for example, read path 124-1, read path 124-2, read path 124-3, read path 124-4, and read path 124-5. The read path is configured to sense the data latched in the corresponding set latch. For example, according to whether a high level at the sense node SO is discharged to a low level, the data latched in the corresponding latch can be sensed. For example, if the high level at the sense node SO is discharged to the low level, the data latched in the latch is "1", and if the sense node SO maintains a high level, the data latched in the latch is "0".

The read path may also be configured to transmit data among different latches. For example, the data in the latch 122-1 is sensed with the read path 124-1 and the sensed result is obtained. The sensed result can be reflected in the voltage change or final voltage value of the sense node SO, and then according to the sensed result, the data of other latches can be set, so as to realize the function of data transmission among different latches. For example, when the sensed result indicates that the data latched in the latch 122-1 is "1", other latches can also be set to "1" using the obtained sensed result, that is, the data latched in the latch 122-1 is transmitted to other latches.

In some implementations, a plurality of read paths are respectively provided corresponding to a plurality of latches.

In other implementations, at least two of the plurality of latches share a common read path. On the one hand, at least two latches sharing a common read path can reduce the number of read paths in the page buffer, thereby reducing the area of the page buffer in the peripheral circuit; on the other hand, when the area occupied by the page buffer remains unchanged, a larger number of latches can be provided to meet the requirement of the memory of higher bit data, so that more bit data information can be stored, which is conducive to improving the bit density of the memory.

In some implementations, the second transistor 132 includes at least one of a high voltage transistor or a low voltage transistor, and the first transistor 131 includes a low low voltage transistor. The first transistor 131 and the second transistor 132 include, but are not limited to, a P-type transistor or an N-type transistor. In the implementation of the present disclosure, the first transistor 131 and the second transistor 132 are illustrated with N-type transistors as an example.

For example, when the data latched in the latch 122 is "1", the first transistor 131 is turned on, a bias voltage VRD is applied to the control terminal of the second transistor 132, the second transistor 132 is turned on, and the high level at the sense node SO is discharged to the low level through the read path 124. For another example, when the data latched in the latch 122 is "0", the first transistor 131 is turned off, the bias voltage VRD is applied to the control terminal of the second transistor 132, the second transistor 132 is turned on, and the sense node SO maintains a high level.

In some implementations, the absolute value of the threshold voltage of the second transistor 132 is larger than that of the first transistor 131; the thickness of the gate dielectric layer of the second transistor 132 is larger than that of the first transistor 131; the length of the channel of the second transistor 132 is larger than that of the first transistor 131. In an implementation, the thickness of the gate dielectric layer of the second transistor 132 is 32 Å, and the thickness of the gate dielectric layer of the first transistor 131 is smaller than 32 Å.

In some implementations, the bias voltage VRD is smaller than the sensed voltage VSO at the sense node SO. In this way, the voltage at the first terminal of the first transistor 131 can be clamped to avoid breakdown of the first transistor 131.

In the implementation of the present disclosure, by making the characteristic size of the first transistor in the read path be smaller than the characteristic size of the first type transistor, the area of the read path in the page buffer can be reduced, and the area of the page buffer can be further reduced.

In some implementations, as shown in FIG. 3, the first type transistor includes: a third transistor 133 and a fourth transistor 134, a first terminal of the third transistor 133 is coupled to the power supply terminal, and a second terminal of the third transistor 133 is coupled to the sense node SO; a first terminal of the fourth transistor 134 is coupled to a control terminal of the third transistor 133, a second terminal of the fourth transistor 134 is coupled to the ground terminal, and a control terminal of the fourth transistor 134 is configured to receive a first control signal Prech_charge_All.

The third transistor 133 and the fourth transistor 134 include, but are not limited to, a P-type transistor or an N-type transistor. In the implementation of the present disclosure, the third transistor 133 of a P-type transistor and the fourth transistor 134 of an N-type transistor will be described as an example.

The process of charging the bit line BL by the precharge and discharge circuit 121 includes: the first control signal Prech_charge_all being enabled, the fourth transistor 134 being turned on, the ground voltage from the ground terminal being supplied to the control terminal of the third transistor 133, the third transistor 133 being turned on, and the sense node SO being precharged to the high level.

The process of discharging the bit line BL by the precharge and discharge circuit 121 includes: the first control signal Prech_charge_all being not enabled, the fourth transistor 134 being turned off, the third transistor 133 being turned off in response to the high level of the sense latch, and the sense node SO being grounded and discharged to the low level through the precharge and discharge circuit 121.

It should be noted that in the process of a programming operation, it is necessary to determine whether to charge the bit line according to the programming verification results (for example, the level magnitude of the sense latch). For example, when the programming verification result indicates that the memory cell reaches a target threshold voltage, the bit line coupled to the memory cell needs to be charged to the programming forbidden bit line voltage (e.g., VDD) to forbid programming; when the programming verification result indicates that the memory cell does not reach the target threshold voltage, it is necessary to adjust the bit line coupled to the memory cell to the normal programming bit line voltage (for example, VSS) or the bit line forced voltage (larger than VSS and smaller than VDD) to continue programming.

In some implementations, as shown in FIG. 3, the plurality of latches include: a sense latch 122-1 which includes a second type transistor, wherein the first type transistor also includes a fifth transistor 135 and a sixth transistor 136, a first terminal of the fifth transistor 135 is coupled to the power supply terminal, a second terminal of the fifth transistor 135 is coupled to the control terminal of the third transistor 133, and a control terminal of the fifth transistor 135 is configured to receive a second control signal Prech_charge_dis. wherein a control terminal of the sixth transistor 136 is configured to receive a third control signal Sa_iso, and wherein the second control signal Prech_charge_dis is different from the first control signal Prech_charge_all and the third control signal Sa_iso is different from the second control signal Prech_charge_dis.

The sense latch 122-1 is configured to store the forbiddance information and the verification information from the verification operation.

The fifth transistor 135 and the sixth transistor 136 include, but are not limited to, a P-type transistor or an N-type transistor. In the implementation of the present disclosure, the fifth transistor 135 of a P-type transistor and the sixth transistor 136 of an N-type transistor will be described as an example.

It should be pointed out that after replacing the transistor in the sense latch 122-1 with the second type transistor having a smaller characteristic size, it will be difficult for the precharge and discharge circuit in the related technology to control whether to charge the bit line. For example, the threshold voltage of the second type transistor becomes smaller, and accordingly, the voltage of the sense latch 122-1 decreases, and the third transistor 133 cannot be turned off.

In the implementation of the present disclosure, before precharging the bit line BL, the second control signal Prech_charge_dis is enabled, the fifth transistor 135 is turned on, the power supply voltage VDD from the power supply terminal is supplied to the control terminal of the third transistor 133, and the third transistor 133 is turned off; the third control signal Sa_iso is not enabled, the sixth transistor 136 is turned off, and thus, even if the voltage of the sense latch 122-1 decreases, the third transistor 133 can also be turned off to ensure the normal operation of the page buffer.

In other implementations, when the sense latch 122-1 does not include the second type transistor, the precharge and discharge circuit in the related technology can be adopted, that is, the fifth transistor and the sixth transistor are omitted, and those skilled in the art can make a choose according to the actual requirements, which is not limited in the present disclosure.

In some implementations, as shown in FIG. 4, the latch 122 includes a first inverter 141, a second inverter 142, a seventh transistor 145, an eighth transistor 146, and a ninth transistor 147; wherein an output of the first inverter 141 is coupled with an input of the second inverter 142, an input terminal of the first inverter 141 is coupled with an output terminal of the second inverter 142, a first terminal of the seventh transistor 145 is coupled to a first node 143, a first terminal of the eighth transistor 146 is coupled to a second node 144, a second terminal of the seventh transistor 145 and a second terminal of the eighth transistor 146 are coupled to a third node 148, a first terminal of the ninth transistor 147 is coupled to the third node 148, and a second terminal of the ninth transistor 147 is coupled to a ground terminal.

In some implementations, the seventh transistor 145 is a reset transistor or a set transistor, and the eighth transistor 146 is a set transistor or a reset transistor. The seventh transistor 145, the eighth transistor 146, and the ninth transistor 147 include, but are not limited to, P-type transistors or N-type transistors. The second type transistor includes at least one of the seventh transistor 145, the eighth transistor 146, and the ninth transistor 147.

When the seventh transistor 145 and the ninth transistor 147 are turned on, a ground voltage of the ground terminal can be transmitted to the first node 143; when the eighth transistor 146 and the ninth transistor 147 are turned on, the ground voltage of the ground terminal can be transmitted to the second node 144.

In some implementations, the data actually latched by the latch 122 can be determined by the level information at the first node 143 of the latch 122. For example, if the first node 143 of the latch 122 is at a low level, the latch 122 latches data "0"; if the first node 143 of the latch 122 is at a high level, the latch 122 latches data "1". Here, the first node 143 is coupled to the control terminal of the first transistor 131.

In some implementations, the plurality of latches also include a low voltage latch 122-2, a data latch (e.g., D1 latch 122-3 and D2 latch 122-4), and a cache latch 122-5. The low voltage latch 122-2 is configured to store forbidding information and adjusted verification information from the verification operation, the data latch is configured to store physical page (e.g., low page LP, medium page MP, high page UP, or extra page XP) information, and the cache latch 122-5 is configured to exchange data with the external, for example, first transmitting the external data to the cache latch 122-5, then transmitting it to the sense latch 122-1 through the cache latch 122-5. As another example, the data in the sense latch 122-1 is transmitted to the cache latch 122-5, and then transmitted to the external through the cache latch 122-5. The external can be a memory controller or a host.

Based on the above memory, the implementation of the present disclosure also provides an operation method of a memory.

FIG. 5 is a flowchart of an operation method of a memory provided by an implementation of the present disclosure. The memory includes a memory cell array and a page buffer, wherein the page buffer is disposed corresponding to a bit line of the memory cell array, the page buffer includes a precharge and discharge circuit and a plurality of latches, the precharge and discharge circuit is coupled to the bit line through the sense node of the page buffer, and a plurality of latches are respectively coupled to the sense node, wherein the operation method includes at least the following operations:

S210: applying a first voltage to the control terminal of the first type transistor in the precharge and discharge circuit to perform a precharge operation on the bit line;

S220: after performing the precharge operation, applying a second voltage to the control terminal of the second type transistor in at least one latch to perform a programming operation or a reading operation on the memory cell array through the latch, wherein the characteristic size of the second type transistor is smaller than that of the first type transistor. and the second voltage is different from the first voltage.

It should be noted that the operations shown in FIG. 5 are not exclusive, and other operations can be performed before, after or between any of the operations in the operation shown; the sequence of the operations shown in FIG. 5 can be adjusted according to actual requirements.

The operations in FIG. 5 will be described in detail below in combination with the timing diagrams in FIG. 6A and FIG. 6B and the page buffer 120 in FIG. 3.

In operation S210, a first voltage is applied to the control terminal of the first type transistor in the precharge and discharge circuit to perform a precharge operation on the bit line.

Figure 6B:
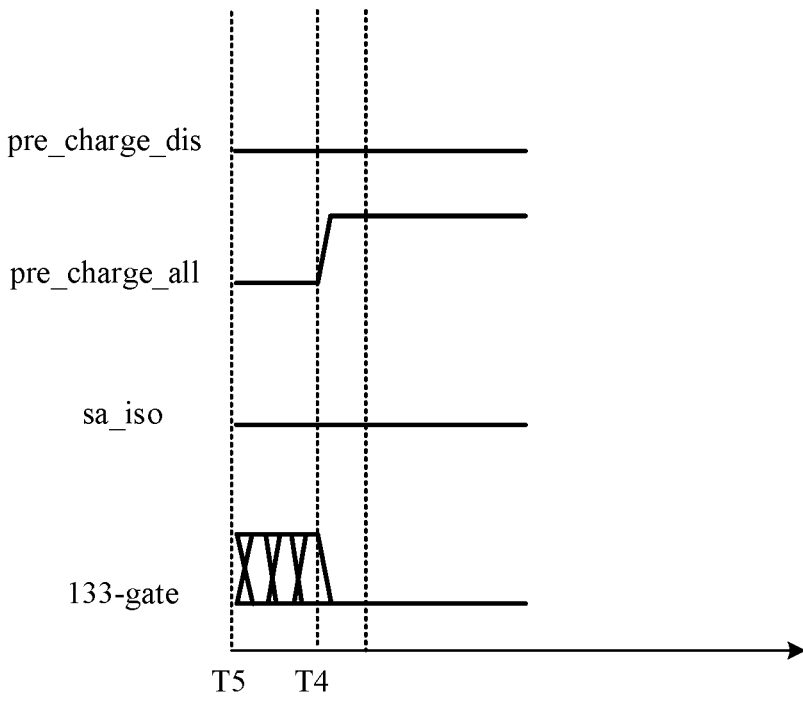

Referring to FIG. 6B, at time T4 (that is, a fourth time), the fourth transistor 134 is turned on in response to the enabled signal Prech_charge_all, the ground voltage from the ground terminal is supplied to the control terminal 133-gate of the third transistor, and the third transistor 133 is turned on, thereby performing a precharge operation on the sense node SO. Here, Prech_charge_all is the signal applied to the control terminal of the fourth transistor 134, and the first voltage is the corresponding high level when the signal Prech_charge_all is enabled. It is understood that the first type transistor includes the fourth transistor 134.

In operation S220, after performing the precharge operation, a second voltage is applied to the control terminal of the second type transistor in at least one latch to perform a programming operation or a reading operation on the memory cell array through the latch; wherein the characteristic size of the second type transistor is smaller than that of the first type transistor and the second voltage is different from the first voltage.

Taking the programming operation as an example, after the time T4, the programming verification result is sensed by the sense latch 122-1, and the bit line voltage is adjusted based on the programming verification result. For example, when the programming verification result indicates that the memory cell reaches the target threshold voltage, the eighth transistor 146 and the ninth transistor 147 are turned on, the second node 144 is at a low level, and the control terminal 133-gate of the third transistor is turned on in response to the low level at the second node 144 to charge the bit line to the programming forbidden bit line voltage VDD; when the programming verification result indicates that the memory cell does not reach the target threshold voltage, the seventh transistor 145 and the ninth transistor 147 are turned on, the second node 144 is at a high level, and the control terminal 133-gate of the third transistor is turned off in response to the high level at the second node 144 to adjust the bit line to the normal programming bit line voltage or the bit line forced voltage.

Taking the reading operation as an example, after the time T4, the bit line voltage is sensed through the sense latch 122-1, and the data in the memory cell is latched into the sense latch 122-1. For example, when the data in the memory cell is "1", the eighth transistor 146 and the ninth transistor 147 are turned on, the first node 143 is at a high level, and the latch 122 latches the data "1"; when the data in the memory cell is "0", the seventh transistor 145 and the ninth transistor 147 are turned on, the first node 143 is at a low level, and the latch 122 latches the data "0".

It is understood that the second type transistor includes at least one of the seventh transistor 145, the eighth transistor 146, and the ninth transistor 147.

The difference between the second voltage and the first voltage includes: the second voltage being larger than the first voltage, or the second voltage being smaller than the first voltage. For example, when the first type transistor and the second type transistor are transistors of the same conductive type (for example, both are N-type transistors), the second voltage is smaller than the first voltage; for another example, when the first type transistor is a P-type transistor and the second type transistor is an N-type transistor, the second voltage is larger than the first voltage. Here, the magnitudes of the second voltage and the first voltage depend on the characteristic size of the channel and the conductive type of the transistor in the actual device.

In some implementations, before performing operation S210, the above operation method further includes turning on the fifth transistor and turning off the fourth transistor and the sixth transistor at a first time.

In some implementations, the turning on the fifth transistor and turning off the fourth transistor and the sixth transistor at the first time includes: applying a first control signal to the control terminal of the fourth transistor, and applying a second control signal to the control terminal of the fifth transistor, wherein the second control signal is different from the first control signal; and applying a third control signal to the control terminal of the sixth transistor, wherein the third control signal is different from the second control signal.

Referring to FIG. 6A, from T1 (i.e., the first time) to time T2, the fifth transistor 135 is turned on in response to the enabled signal Prech_charge_dis (e.g., low level), the power supply voltage VDD from the power supply terminal is supplied to the control terminal of the third transistor 133, and the third transistor 133 is turned off; the fourth transistor 134 and the sixth transistor 136 are turned off in response to the non-enabled signal Prech_charge_all (e.g., low level) and the non-enabled signal Sa_iso (e.g., low level).

Here, the enabled signal Prech_charge_dis is a second control signal applied to the control terminal of the fifth transistor 135; the non-enabled signal Prech_charge_all is a first control signal applied to the control terminal of the fourth transistor 134; the non-enabled signal Sa_iso is a third control signal applied to the control terminal of the sixth transistor 136.

In the implementation of the present disclosure, by turning on the fifth transistor and turning off the fourth transistor and the sixth transistor before precharging, the third transistor can be turned off even if the sense latch includes a second type transistor with a smaller threshold voltage, so as to ensure the normal operation of the page buffer.

In some implementations, the above operation method also includes: turning off the fifth transistor at a second time after the first time; and turning on the sixth transistor at a third time after the second time.

Referring to FIG. 6A, at time T2 (that is, the second time), the fifth transistor 135 is turned off in response to the non-enabled signal Prech_charge_dis (e.g., high level), and the fourth transistor 134 and the sixth transistor 136 continue to being turned off. At this time, the third transistor 133 is in a floating state.

Referring to FIG. 6A, at time T3 (that is, the third time), the sixth transistor 136 is turned on in response to the enabled signal Sa_iso (e.g., high level), and the fourth transistor 134 and the fifth transistor 135 continue being turned off. At this time, the third transistor 133 turns on or off based on the data latched by the sense latch 122-1. The following will be explained in combination with FIGS. 3 and 4.

For example, when the sense latch 122-1 latches data "0" (that is, the first node 143 is at the low level), the second node 144 is at the high level, and the control terminal 133-gate of the third transistor 133 is turned off in response to the high level at the second node 144, as shown by the dotted line in FIG. 6A.

For another example, when the sense latch 122-1 latches data "1" (that is, the first node 143 is at a high level), the second node 144 is at a low level, and the control terminal 133-gate of the third transistor 133 is turned on in response to the low level at the second node 144.

In the implementation of the present disclosure, by turning on the fifth transistor and turning of the fourth transistor and the sixth transistor at the first time, turning off the fifth transistor, the fourth transistor and the sixth transistor at the second time and turning on the sixth transistor and turning off the fourth transistor and the fifth transistor at the third time, the data latched in the sense latch can be accurately transmitted to the precharge and discharge circuit, so that the precharge and discharge circuit can adjust the bit line voltage based on the data latched in the sense latch.

In some implementations, the above operation S210 includes: turning off the fifth transistor and the sixth transistor at the fourth time after the first time, applying a first voltage to the control terminal of the fourth transistor, and turning on the fourth transistor.

Referring to FIG. 6B, at time T4, the fifth transistor 135 is turned off in response to the non-enabled signal Prech_charge_dis (e.g., high level), and the sixth transistor 136 is turned off in response to the non-enabled signal Sa_iso (e.g., high level), and the fourth transistor 134 is turned on in response to the enabled signal Prech_charge_all (e.g., high level), thus a precharge operation is performed on the sense node SO. It can be understood that by adding the fifth transistor and the sixth transistor to the precharge and discharge circuit, the third transistor can be turned off before precharging. Therefore, during precharging, it is necessary to turn off the fifth transistor and the sixth transistor to avoid the impact on the precharge operation. Here, T4 is after T3.

In some implementations, the above operation method also includes turning off the fourth transistor, the fifth transistor and the sixth transistor after the first time and before the fourth time.

Referring to FIG. 6B, at time T5, the fourth transistor 134, the fifth transistor 135, and the sixth transistor 136 are turned off in respond to the non-enabled signal Prech_charge_all, the non-enabled signal Prech_charge_dis, and the non-enabled signal Sa_iso, respectively. Here, T5 is between T3 and T4.

In some implementations, the above operation method also includes: applying a bias voltage to the control terminal of the second transistor after performing a precharge operation; wherein the characteristic size of the second transistor is larger than that of the first transistor and the bias voltage is smaller than the sensed voltage of the sense node. Here, after the precharge operation is performed, a bias voltage is applied to the control terminal of the second transistor, and the data latched in the correspondingly set latch can be sensed through the read path.

For example, when the data latched in the latch 122 is "1", the first transistor 131 is turned on, the bias voltage VRD is applied to the control terminal of the second transistor 132, the second transistor 132 is turned on, and the high level at the sense node SO is discharged to the low level through the read path 124. For another example, when the data latched in the latch 122 is "0", the first transistor 131 is turned off, the bias voltage VRD is applied to the control terminal of the second transistor 132, the second transistor 132 is turned on, and the sense node SO maintains a high level.

The implementation of the present disclosure also provides a memory system, as shown in FIG. 1A. The memory system 30 includes:

one or more memories 100 according to any one of the above implementations;

a memory controller 32 coupled to the memories 100 and configured to control the memories 100.

The implementation of the present disclosure also provides an electronic device, as shown in FIG. 1A, including a memory system 30 according to the above implementation.

It should be understood that "one implementation" or "an implementation" mentioned throughout the description means that features, structures or characteristics related to the implementation are included in at least one implementation of the present disclosure. Therefore, "in one implementation" or "in an implementation" appearing throughout the description may not necessarily refer to the same implementation. Further, these features, structures, or characteristics may be combined in any suitable manner in one or more implementations. It should be understood that in various implementations of the present disclosure, the size of the sequence number of the above processes does not mean a succession of the sequence of execution, and the sequence of execution of each process should be determined by its function and internal logic, and should not constitute any restriction on the implementation process of the implementations of the present disclosure. The above sequence number of the implementations of the present disclosure is only for description and does not represent the advantages and disadvantages of the implementations.

It should be noted that, the terms "include", "comprise" or any other variation thereof herein are intended to cover non-exclusive inclusion, so that a process, method, article or device that includes a series of elements includes not only those elements, but also other elements not explicitly listed, or elements inherent in such a process, method, article or device. Without further limit, the element defined by the statement "including a . . . " does not exclude the existence of other identical elements in the process, method, article or device that includes the element.

In view of this, the implementation of the present disclosure provides a memory, an operation method thereof, a memory system, and an electronic device.

In a first aspect, the implementation of the present disclosure provides a memory, wherein the memory includes a memory cell array and a page buffer, the page buffer is disposed corresponding to a bit line of the memory cell array, and the page buffer includes:

a precharge and discharge circuit coupled to the bit line through a sense node of the page buffer and including a first type transistor; and a plurality of latches respectively coupled to the sense node, wherein at least one of the plurality of latches includes a second type transistor, and a characteristic size of the second type transistor is smaller than that of the first type transistor.

In a second aspect, the implementation of the present disclosure also provides an operation method of a memory, wherein the memory includes a memory cell array and a page buffer, the page buffer is disposed corresponding to a bit line of the memory cell array, the page buffer includes a precharge and discharge circuit and a plurality of latches, the precharge and discharge circuit is coupled to the bit line through a sense node of the page buffer, the plurality of latches are respectively coupled to the sense node, and the operation method includes:

applying a first voltage to a control terminal of a first type transistor in the precharge and discharge circuit to perform a precharge operation on the bit line; and after performing the precharge operation, applying a second voltage to a control terminal of a second type transistor in at least one latch of the plurality of latches to perform a programming operation or a reading operation on the memory cell array through the at least one latch, wherein a characteristic size of the second type transistor is smaller than that of the first type transistor and the second voltage is different from the first voltage.

In a third aspect, the implementation of the present disclosure also provides a memory system which includes:

one or more memories of any one of the above implementations; and a memory controller coupled to the memories and configured to control the memories.

In a fourth aspect, the implementation of the present disclosure also provides an electronic device including a memory system of the above implementation.

In the implementation of the present disclosure, by making at least one of a plurality of latches include a second type transistor, and a characteristic size of the second type transistor be smaller than that of the first type transistor, the area of at least one latch in the page buffer can be reduced, and then the area of the page buffer in the peripheral circuit can be reduced, which is conducive to reducing the area of the peripheral circuit in the memory, so as to realize the miniaturization of the memory.

Moreover, in the implementation of the present disclosure, at least one latch adopts a second type transistor with a smaller characteristic size. Accordingly, the voltage required for the operation of the second type transistor is smaller, which is conducive to reducing the power consumption of the memory.

The above is only the implementation of the present disclosure, but the scope of protection of the present disclosure is not limited to this. Changes or replacements which can be easily thought of by any person skilled in the art within the scope of the technology disclosed in the present disclosure should be covered by the scope of protection of the present disclosure. Therefore, the scope of protection of the present disclosure shall be defined by the scope of protection of the claims.

What is claimed is:

1. A memory, wherein the memory includes a memory cell array and a page buffer, the page buffer is disposed corresponding to a bit line of the memory cell array, and the page buffer includes:

a precharge and discharge circuit coupled to the bit line through a sense node of the page buffer and including at least one transistor of a first type; and a plurality of latches respectively coupled to the sense node, wherein the plurality of latches includes at least one transistor of a second type, and a characteristic size of the at least one transistor of the second type is smaller than that of the at least one transistor of the first type, wherein the page buffer further includes a read path and the read path includes:

a first transistor, wherein a first terminal of the first transistor is coupled to the sense node, a second terminal of the first transistor is coupled to a ground terminal, and a control terminal of the first transistor is coupled to an output terminal of a latch of the plurality of latches and wherein a characteristic size of the first transistor is smaller than that of the at least one transistor of the first type, and a second transistor, wherein a first terminal of the second transistor is coupled to the sense node, a second terminal of the second transistor is coupled to the first terminal of the first transistor, and a control terminal of the second transistor is configured to receive a bias voltage, and wherein a characteristic size of the second transistor is larger than that of the first transistor.

2. The memory according to claim 1, wherein the bias voltage is smaller than a sensed voltage of the sense node.

3. The memory according to claim 1, wherein the page buffer includes:

a third transistor, wherein a first terminal of the third transistor is coupled to a power supply terminal, and a second terminal of the third transistor is coupled to the sense node; and a fourth transistor, wherein a first terminal of the fourth transistor is coupled to a control terminal of the third transistor, a second terminal of the fourth transistor is coupled to a ground terminal, and a control terminal of the fourth transistor is configured to receive a first control signal.

4. The memory according to claim 3, wherein the plurality of latches include: a sense latch which includes at least one transistor of the second type, and wherein the at least one transistor of the first type further includes:

a fifth transistor, wherein a first terminal of the fifth transistor is coupled to the power supply terminal, a second terminal of the fifth transistor is coupled to the control terminal of the third transistor, and a control terminal of the fifth transistor is configured to receive a second control signal, and wherein the second control signal is different from the first control signal; and a sixth transistor, wherein a first terminal of the sixth transistor is coupled to the control terminal of the third transistor, a second terminal of the sixth transistor is coupled to the sense latch, and a control terminal of the sixth transistor is configured to receive a third control signal, and wherein the third control signal is different from the second control signal.

5. The memory according to claim 4, wherein
the third transistor and the fifth transistor include a P-type; and
the fourth transistor and the sixth transistor include an N-type.

6. The memory according to claim 1, wherein the page buffer further includes:

a bit line voltage setting circuit coupled to the precharge and discharge circuit, the sense node and the bit line respectively, and including at least one transistor of a third type, wherein the characteristic size of the at least one transistor of the second type is smaller than that of the at least one transistor of the third type.

7. The memory according to claim 1, wherein an absolute value of a threshold voltage of the at least one transistor of the second type is smaller than that of the at least one transistor of the first type.

8. The memory according to claim 1, wherein a thickness of a gate dielectric layer of the at least one transistor of the second type is smaller than that of the at least one transistor of the first type; and a length of a channel of the at least one transistor of the second type is smaller than that of the at least one transistor of the first type.

9. An operation method of a memory, wherein the memory includes a memory cell array and a page buffer, the page buffer is disposed corresponding to a bit line of the memory cell array, the page buffer includes a precharge and discharge circuit and a plurality of latches, the precharge and discharge circuit is coupled to the bit line through a sense node of the page buffer, the plurality of latches are respectively coupled to the sense node, and the operation method includes:

applying a first voltage to a control terminal of at least one transistor of a first type in the precharge and discharge circuit to perform a precharge operation on the bit line; and after performing the precharge operation, applying a second voltage to a control terminal of at least one transistor of a second type in the plurality of latches to perform a programming operation or a reading operation on the memory cell array through the latch with the at least one transistor of the second type, wherein a characteristic size of the at least one transistor of the second type is smaller than that of the at least one transistor of the first type and the second voltage is different from the first voltage, wherein the page buffer further includes a read path, the read path includes a first transistor and a second transistor, a first terminal of the first transistor is coupled to a second terminal of the second transistor, a second terminal of the first transistor is coupled to a ground terminal, a control terminal of the first transistor is coupled to an output terminal of a latch of the plurality of latches and a first terminal of the second transistor is coupled to the sense node; and applying a bias voltage to a control terminal of the second transistor after performing the precharge operation, wherein the characteristic size of the second transistor is larger than that of the first transistor and the bias voltage is smaller than a sensed voltage of the sense node.

10. The operation method according to claim 9, wherein the plurality of latches include a sense latch including at least one transistor of the second type, wherein the at least one transistor of the first type includes a third transistor, a fourth transistor, a fifth transistor and a sixth transistor, wherein a first terminal of the third transistor is coupled to a power supply terminal, and a second terminal of the third transistor is coupled to the sense node, wherein a first terminal of the fourth transistor is coupled to a control terminal of the third transistor, and a second terminal of the fourth transistor is coupled to a ground terminal, wherein a first terminal of the fifth transistor is coupled to the power supply terminal, and a second terminal of the fifth transistor is coupled to the control terminal of the third transistor, wherein a first terminal of the sixth transistor is coupled to the control terminal of the third transistor, and a second terminal of the sixth transistor is coupled to the sense latch;

wherein before applying the first voltage to the control terminal of the at least one transistor of the first type in the precharge and discharge circuit, the operation method further includes:

turning on the fifth transistor and turning off the fourth transistor and the sixth transistor at a first time.

11. The operation method according to claim 10, wherein the operation method further includes:

turning off the fifth transistor at a second time after the first time; and turning on the sixth transistor at a third time after the second time.

12. The operation method according to claim 10, wherein the turning on the fifth transistor and turning off the fourth transistor and the sixth transistor at the first time includes:

applying a first control signal to a control terminal of the fourth transistor;

applying a second control signal to a control terminal of the fifth transistor, wherein the second control signal is different from the first control signal; and applying a third control signal to a control terminal of the sixth transistor, wherein the third control signal is different from the second control signal.

13. The operation method according to claim 10, wherein the applying the first voltage to the control terminal of the at least one transistor of the first type in the precharge and discharge circuit includes:

at a fourth time after the first time, turning off the fifth transistor and the sixth transistor, applying the first voltage to a control terminal of the fourth transistor, and turning on the fourth transistor.

14. The operation method according to claim 13, wherein the operation method further includes:

after the first time and before the fourth time, turning off the fourth transistor, the fifth transistor, and the sixth transistor.

15. The operation method according to claim 9, wherein a thickness of a gate dielectric layer of the at least one transistor of the second type is smaller than that of the at least one transistor of the first type; and a length of a channel of the at least one transistor of the second type is smaller than that of the at least one transistor of the first type.

16. A memory system including:

one or more memories; and a memory controller coupled to the one or more memories and configured to control the one or more memories, wherein each of the one or more memories includes a memory cell array and a page buffer, the page buffer is disposed corresponding to a bit line of the memory cell array, and the page buffer includes:

a precharge and discharge circuit coupled to the bit line through a sense node of the page buffer and including at least one transistor of a first type; and a plurality of latches respectively coupled to the sense node, wherein the plurality of latches includes at least one transistor of a second type, and a characteristic size of the at least one transistor of the second type is smaller than that of the at least one transistor of the first type, wherein the page buffer further includes a read path and the read path includes:

a first transistor, wherein a first terminal of the first transistor is coupled to the sense node, a second terminal of the first transistor is coupled to a ground terminal, and a control terminal of the first transistor is coupled to an output terminal of a latch of the plurality of latches, and wherein a characteristic size of the first transistor is smaller than that of the at least one transistor of the first type, and a second transistor, wherein a first terminal of the second transistor is coupled to the sense node, a second terminal of the second transistor is coupled to the first terminal of the first transistor, and a control terminal of the second transistor is configured to receive a bias voltage, and wherein a characteristic size of the second transistor is larger than that of the first transistor.

* * * * *